US012431841B2

(12) United States Patent
Chang

(10) Patent No.: US 12,431,841 B2
(45) Date of Patent: Sep. 30, 2025

(54) MULTI-BAND VOLTAGE CONTROLLED OSCILLATOR

(71) Applicant: RichWave Technology Corp., Taipei (TW)

(72) Inventor: Po-Chun Chang, Taipei (TW)

(73) Assignee: RichWave Technology Corp., Taipei (TW)

( * ) Notice: Subject to any disclaimer, the term of this patent is extended or adjusted under 35 U.S.C. 154(b) by 47 days.

(21) Appl. No.: 18/537,821

(22) Filed: Dec. 13, 2023

(65) Prior Publication Data

US 2025/0125771 A1 Apr. 17, 2025

(30) Foreign Application Priority Data

Oct. 16, 2023 (TW) ................................ 112139381

(51) Int. Cl.
*H03B 5/12* (2006.01)

(52) U.S. Cl.
CPC ......... *H03B 5/1228* (2013.01); *H03B 5/1212* (2013.01); *H03B 5/129* (2013.01); *H03B 2201/0208* (2013.01)

(58) Field of Classification Search
CPC .................................................... H03B 5/1228
USPC ....................................... 331/122, 8, 117 FE
See application file for complete search history.

(56) References Cited

U.S. PATENT DOCUMENTS 6,861,913 B1 3/2005 Herzel
8,044,732 B2 * 10/2011 Kossel ................ H03B 5/1256 331/181
2017/0141728 A1 * 5/2017 Chen .................... H03B 5/1852
2017/0244361 A1 * 8/2017 Farazian ............. H03B 5/1212
2024/0348257 A1 * 10/2024 Sadhu ................. H03B 5/1215

OTHER PUBLICATIONS

Office action mailed on Aug. 6, 2024 for the Taiwan application No. 112139381, filing date Oct. 16, 2023, pp. 1-9.

* cited by examiner

*Primary Examiner* — Joseph Chang
(74) *Attorney, Agent, or Firm* — Winston Hsu

(57) ABSTRACT

A voltage controlled oscillator includes a cross coupled pair circuit, a first capacitive circuit, a first inductor, a second inductor, a second capacitive circuit and a first switch circuit. The first capacitive circuit is arranged in parallel with the cross coupled pair circuit. The first inductor is arranged in parallel with the cross coupled pair circuit and has a center tapped node for receiving a power supply voltage. The second inductor is magnetically coupled with the first inductor and has a center tapped node for receiving a first control voltage. The second capacitive circuit is arranged in parallel with the second inductor. The first switch circuit is arranged in parallel with the second inductor and configured to be turned on or turned off by a second control voltage. The first control voltage and the second control voltage change synchronously.

20 Claims, 6 Drawing Sheets

100
120
118
117
VCTRL2
116
115
VCTRL1
114
K
112
VDD
106
108
110
105
VCTRL4
101
102
104

MULTI-BAND VOLTAGE CONTROLLED OSCILLATOR

TECHNICAL FIELD

The invention provides a voltage controlled oscillator, particularly a multi-band voltage controlled oscillator.

BACKGROUND

When using a voltage controlled oscillator, the frequency of the oscillation signal can be changed by fine-tuning the capacitor values. However, when the frequency band used by the signal changes significantly, two or more voltage controlled oscillators with different frequency bands can be used to implement multi-band output. However, the two or more voltage-controlled oscillators takes a lot of space in the circuit implementation.

SUMMARY

A voltage controlled oscillator includes a cross coupled pair circuit, a first capacitive circuit, a first inductor, a second inductor, a second capacitive circuit and a first switch circuit. The first capacitive circuit is arranged in parallel with the cross coupled pair circuit. The first inductor is arranged in parallel with the cross coupled pair circuit and has a center tapped node for receiving a power supply voltage. The second inductor is magnetically coupled with the first inductor and has a center tapped node for receiving a first control voltage. The second capacitive circuit is arranged in parallel with the second inductor. The first switch circuit is arranged in parallel with the second inductor and configured to be turned on or turned off by a second control voltage. The first control voltage and the second control voltage change synchronously.

DETAILED DESCRIPTION

Figure 1A:
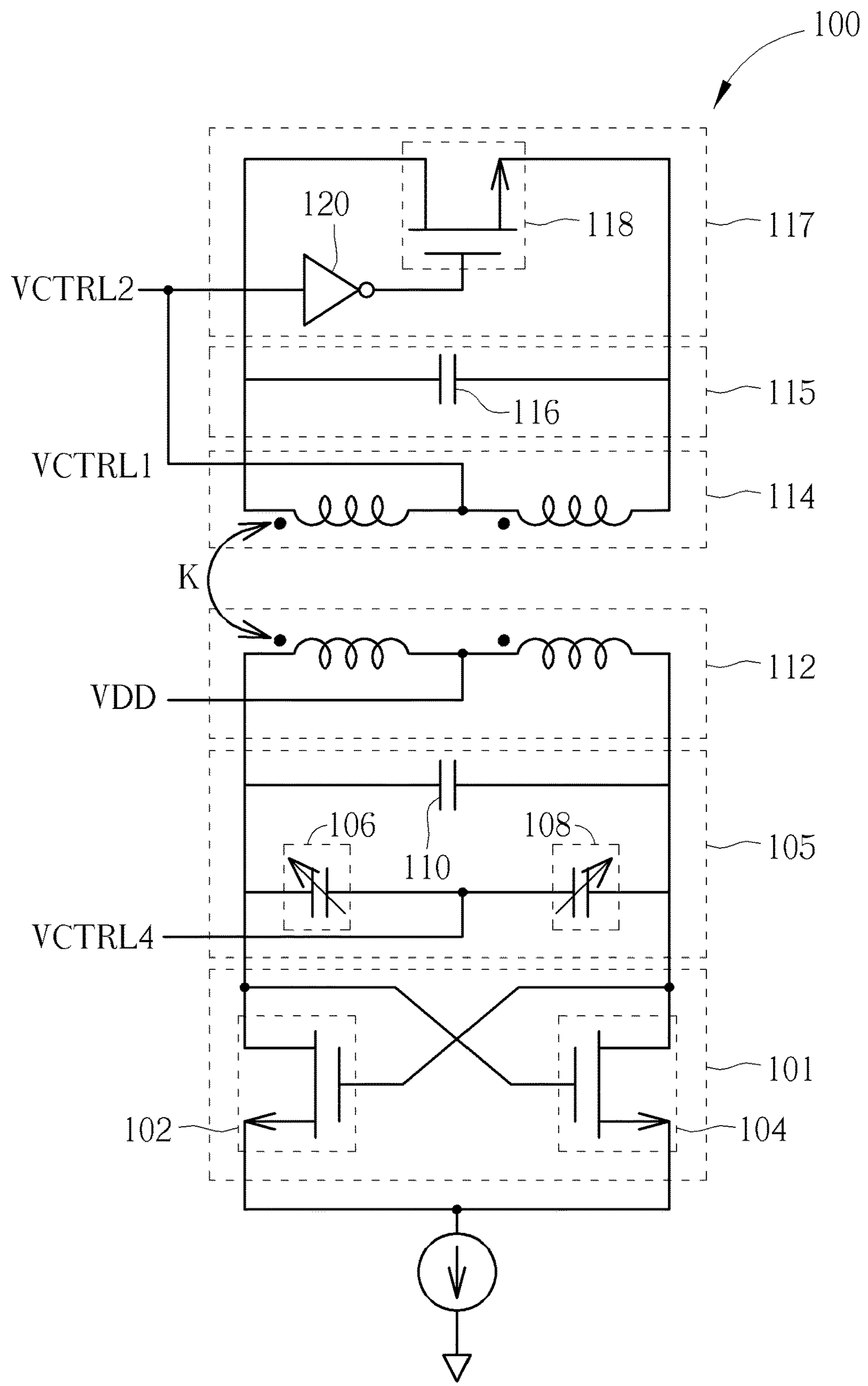
FIG. 1A is a circuit diagram of a voltage controlled oscillator according to an embodiment of the present invention.

Below, exemplary embodiments will be described in detail with reference to accompanying drawings so as to be easily realized by a person having ordinary knowledge in the art. The inventive concept may be embodied in various forms without being limited to the exemplary embodiments set forth herein. Descriptions of well-known parts are omitted for clarity, and like reference numerals refer to like elements throughout.

FIG. 1A is a circuit diagram of a voltage controlled oscillator 100 according to an embodiment of the present invention. The voltage controlled oscillator 100 includes a cross coupled pair circuit 101, a first capacitive circuit 105, a first inductor 112, a second inductor 114, a second capacitive circuit 115 and a first switch circuit 117. The first capacitive circuit 105, the first inductor 112 and the cross coupled pair circuit 101 are arranged in parallel. The first inductor 112 has a center tapped node for receiving the power supply voltage VDD. The second inductor 114 and the first inductor 112 are magnetically coupled, and the second inductor 114 has a center tapped node for receiving the first control voltage VCTRL1. The second capacitive circuit 115, the second inductor 114 and the first switch circuit 117 are arranged in parallel. The first switch circuit 117 is turned on or turned off according to the second control voltage VCTRL2.

The cross coupled pair circuit 101 includes a first transistor 102 and a second transistor 104. The first transistor 102 includes a first end, a second end coupled to a reference voltage end, and a control end. The second transistor 104 includes a first end coupled to the control end of the first transistor 102, a second end coupled to the reference voltage end, and a control end coupled to the first end of the first transistor 102. The cross coupled pair circuit 101 formed by the first transistor 102 and the second transistor 104 is used to provide a negative impedance to the reference voltage end. The reference voltage end is, for example, a ground end or a common end. In this embodiment, the first transistor 102 and the second transistor 104 are coupled to the reference voltage end through a current source.

The first capacitive circuit 105 includes a first capacitor 110. In an embodiment, the capacitance of the first capacitive circuit 105 is variable and controlled by the fourth control voltage VCTRL4. For example, the first capacitive circuit 105 may also include a first variable capacitor 106, a second variable capacitor 108 and a contact end for receiving the fourth control voltage VCTRL4. The first variable capacitor 106 and the second variable capacitor 108 are connected in series. The series circuit formed by the first variable capacitor 106 and the second variable capacitor 108 is set in parallel with the first capacitor 110. As the fourth control voltage VCTRL4 is adjusted, the capacitance values of the first variable capacitor 106 and the second variable capacitor 108 will also change accordingly, thus achieving the purpose of adjusting the frequency of the output oscillation signal of the voltage controlled oscillator 100. The overall capacitance of the first capacitor circuit 105 is the parallel connection result of the first capacitor 110 and series connection of the first variable capacitor 106 and the second variable capacitor 108.

The first inductor 112 has a center tapped node for receiving the power supply voltage VDD and generating an oscillation signal of a single frequency band at both ends. In order to achieve multi-band effects that are different from prior art voltage controlled oscillators, the first inductor 112 and the second inductor 114 are magnetically coupled, and the second inductor 114 has a center tapped node for receiving the first control voltage VCTRL1. Since the first control voltage VCTRL1 can control the equivalent impedance generated by the second inductor 114, the second capacitive circuit 115 and the first switch circuit 117, through the mutual inductance effect of the first inductor 112 and the second inductor 114, the voltage controlled oscillator 100 can not only adjust the capacitance values of the first variable capacitor 106 and the second variable capacitor 108 to slightly change the oscillation frequency, but can also adjust the equivalent impedance generated by the second inductor 114, the second capacitive circuit 115 and the first switch circuit 117, thus greatly changing the oscillation frequency.

The second capacitive circuit 115 includes a second capacitor 116 to provide a capacitance value. If appropriately adjusted, the second capacitive circuit 115 can more easily adjust the frequency of the voltage controlled oscillator 100. In one embodiment, the first switch circuit 117 includes a first switch 118. The control end of the first switch 118 is used to receive a control voltage related to the first control voltage VCTRL1 to turn the first switch 118 on or off. This control voltage can change synchronously with the first control voltage VCTRL1. In this embodiment, the first switch circuit 117 further includes an inverter 120. The control end of the first switch 118 is connected to the output end of the inverter 120. The inverter 120 is used to receive the second control voltage VCTRL2 to turn the first switch 118 on or off. The first control voltage VCTRL1 and the second control voltage VCTRL2 may be the same control voltage and may change synchronously.

Figure 1B:
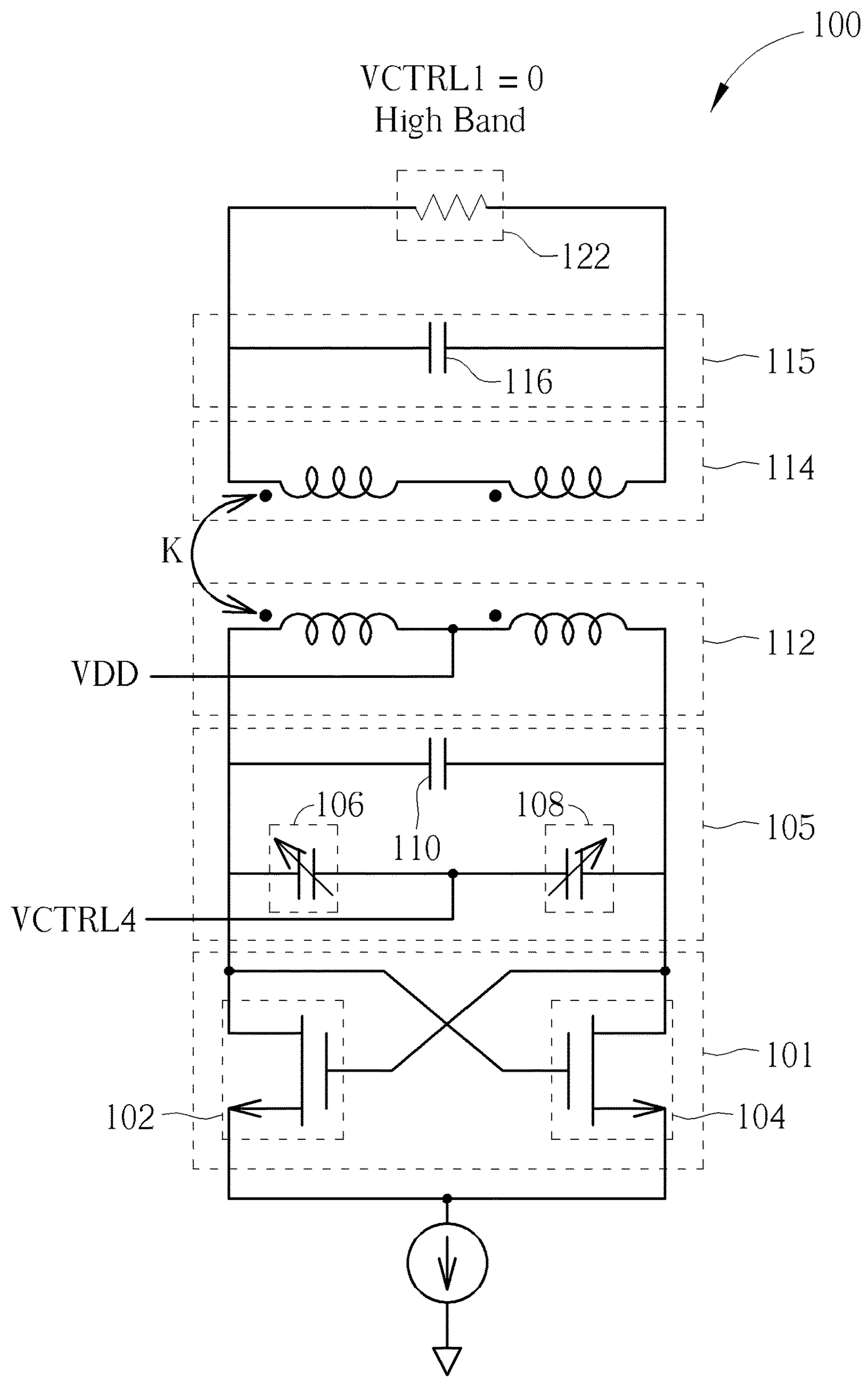
FIG. 1B is a circuit diagram of the voltage controlled oscillator in FIG. 1A operating in the high frequency band.

FIG. 1B is a circuit diagram of the voltage controlled oscillator 100 operating in the high frequency band. As shown in FIG. 1B, when the first control voltage VCTRL1 is the first voltage (for example, a low voltage, VCTRL1=0V), the second control voltage VCTRL2 is also the first voltage (VCTRL2=0V), and the control end of the first switch 118 therefore receives the second voltage (for example, a high voltage). In this way, the first end and the second end of the first switch 118 receive the first voltage. The voltage difference between the first voltage and the second voltage ensures that the first switch 118 to be turned on. A predetermined small equivalent resistor 122 is formed between the first end and the second end of the first switch 118. Because the RLC circuit formed by the equivalent resistor 122, the second capacitive circuit 115 and the second inductor 114 is magnetically coupled to the first inductor 112, the first inductor 112 would output a high-frequency oscillation signal. In another embodiment, the center tapped node of the second inductor 114 does not receive the first control voltage VCTRL1. When the control end of the first switch 118 receives the second voltage and is about to be turned on, because the voltages of the first end and the second end are undefined, the first switch 118 is unable to generate a predetermined equivalent resistance value between the first end and the second end of the first switch 118. The first switch 118 may not be turned on, causing the voltage controlled oscillator 100 to be unable to operate in a predetermined frequency band.

Figure 1C:
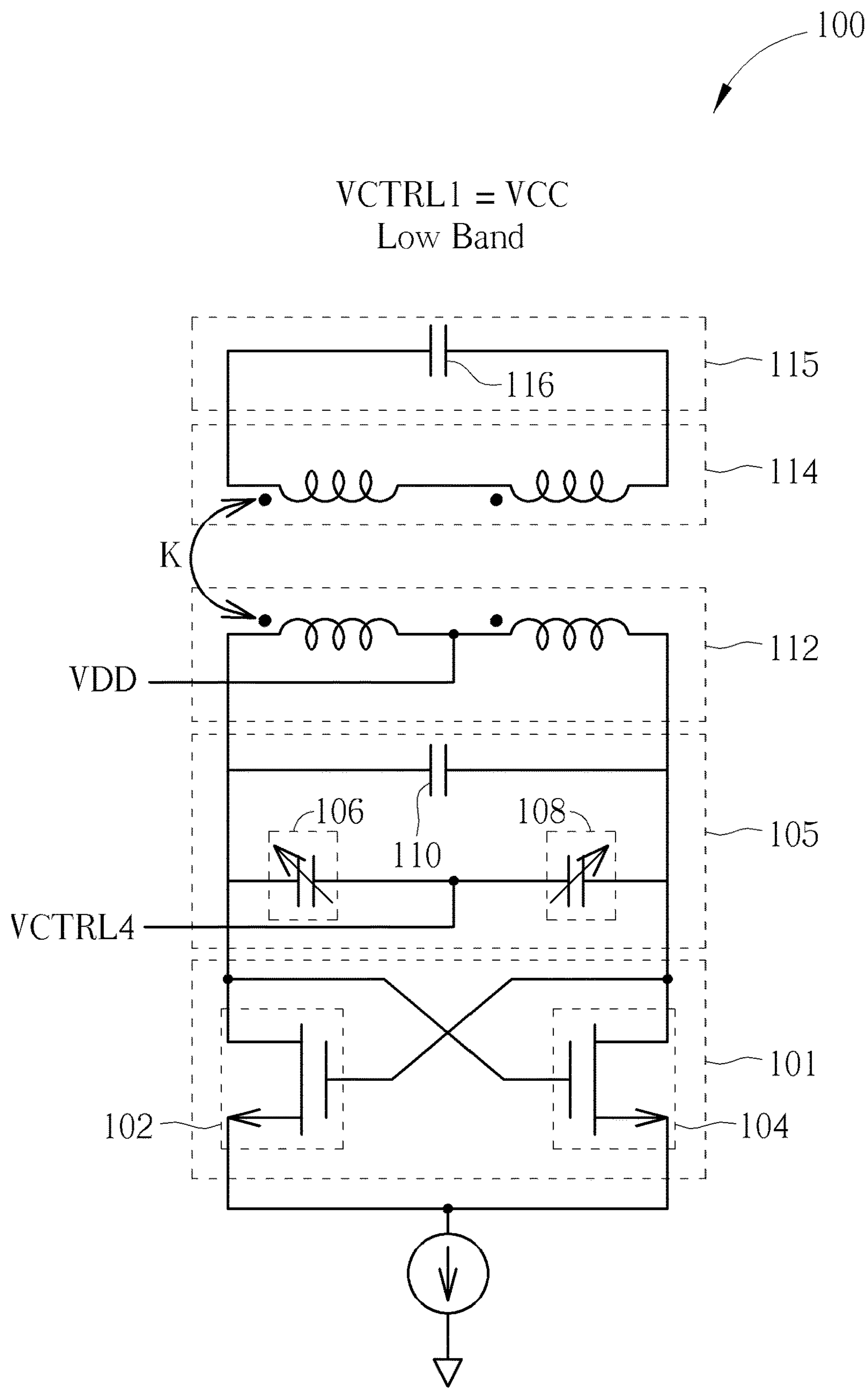
FIG. 1C is a circuit diagram of the voltage controlled oscillator in FIG. 1A operating in the low frequency band.

FIG. 1C is a circuit diagram of the voltage controlled oscillator 100 operating in the low frequency band. As shown in FIG. 1C, when the first control voltage VCTRL1 is the second voltage such as a high voltage (VCTRL1=VCC), the second control voltage VCTRL2 is also a second voltage such as the high voltage (VCTRL2=VCC), the control end of the first switch 118 therefore receives the first voltage. In this way, the first end and the second end of the first switch 118 receive the second voltage. The voltage difference between the first voltage and the second voltage ensures that the first switch 118 to be cut-off such that a nearly infinite resistance is formed between the first end and the second end of the first switch 118. Because the LC circuit formed by the second capacitive circuit 115 and the second inductor 114 is magnetically coupled to the first inductor 112, the first inductor 112 would output an oscillation signal in a lower frequency band. In another embodiment, the center tapped node of the second inductor 114 does not receive the first control voltage VCTRL1. When the control end of the first switch 118 receives the first voltage and is to be turned off, because the voltages of the first end and the second end of the first switch 118 are undefined, a nearly infinite resistance may not be formed between the first end and the second end of the first switch 118. The first switch 118 may be turned on, causing the voltage controlled oscillator 100 failing to operate in the predetermined frequency band.

Figure 2:
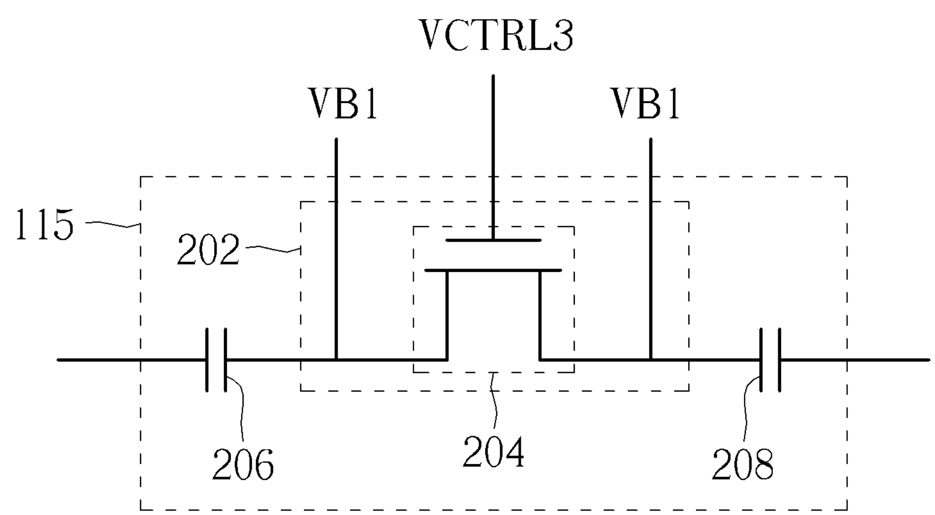
FIG. 2 is a circuit diagram of a second capacitive circuit of the voltage controlled oscillator according to another embodiment of the present invention.

FIG. 2 is a circuit diagram of a second capacitive circuit 115 of the voltage controlled oscillator 100 according to another embodiment of the present invention. In FIG. 2, the second capacitive circuit 115 includes two capacitors 206 and 208, and a second switch circuit 202 disposed between the two capacitors 206 and 208. The second switch circuit 202 includes a second switch 204 for receiving a third control voltage VCTRL3. In this embodiment, the two ends of the second switch 204 may receive the bias voltage VB1 to ensure the second switch 204 is turned on or off. When the first control voltage VCTRL1 is the first voltage (for example, a low voltage), the first switch 118 receives the second voltage (for example, a high voltage) and is turned on, and if the third control voltage VCTRL3 is the second voltage, then the second switch 204 is controlled by the third control voltage VCTRL3 to be turned on. At this time, the voltage controlled oscillator 100 has the first frequency. When the first control voltage VCTRL1 is the second voltage, the first switch 118 receives the first voltage and is turned off. If the third control voltage VCTRL3 is the second voltage, the second switch 204 is controlled by the third control voltage VCTRL3 and is turned on. At this time the voltage controlled oscillator 100 has the second frequency. When the first control voltage VCTRL1 is the second voltage, the first switch 118 receives the first voltage and is turned off. If the third control voltage VCTRL3 is the first voltage, the second switch 204 is controlled by the third control voltage VCTRL3 and is turned off. At this time, the voltage controlled oscillator 100 has the third frequency. The first frequency is higher than the third frequency and the third frequency is higher than the second frequency. When the second capacitive circuit 115 in FIG. 1A is replaced by the second capacitive circuit 115 in FIG. 2, the user can turn on or off the second switch circuit 202 through the third control voltage VCTRL3 to change the second capacitive circuit 115. The equivalent capacitance value thereby changes the oscillation signal frequency of the voltage controlled oscillator 100 to achieve a multi-band effect.

Figure 3:
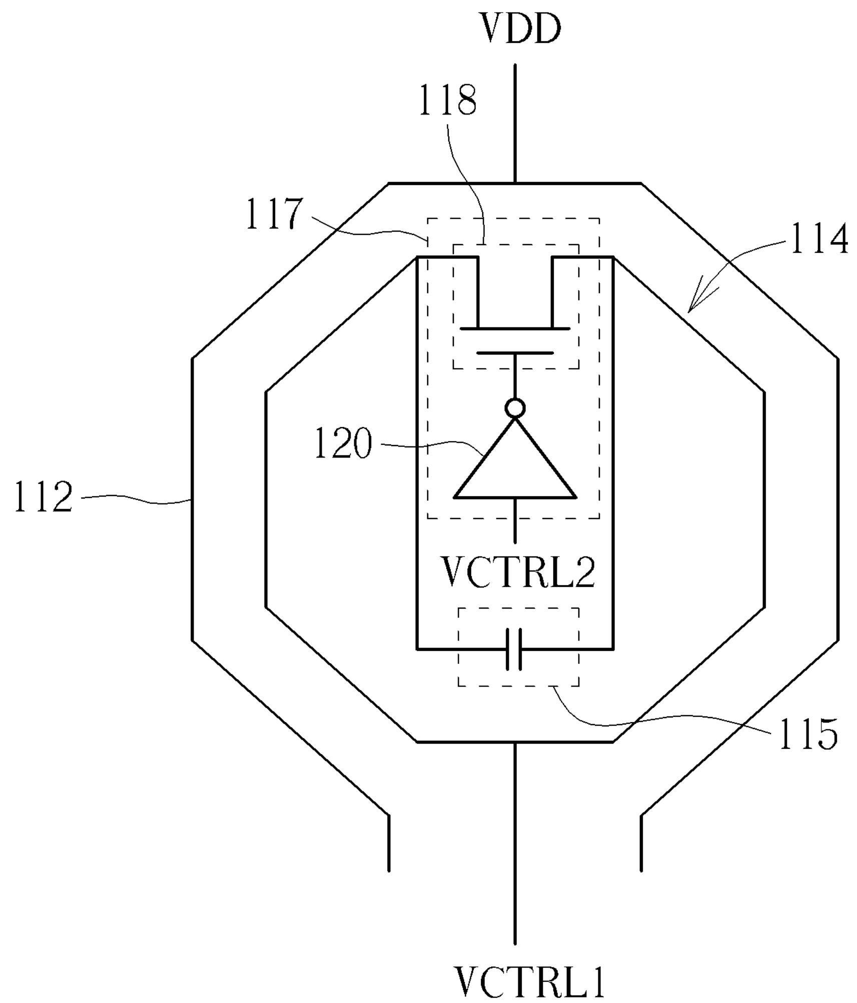
FIG. 3 is a schematic diagram of the first inductor and the second inductor of the voltage controlled oscillator in FIG. 1A.

FIG. 3 is a schematic diagram of the first inductor 112 and the second inductor 114. FIG. 3 shows the first inductor 112, the second inductor 114, the first switch circuit 117 and the second capacitive circuit 115. The first inductor 112 is a polygonal coil, and the center tapped node of the first inductor 112 is used to receive the power supply voltage VDD. The second inductor 114 is also a polygonal coil corresponding to the shape of the first inductor 112. The first inductor 112 and the second inductor 114 are arranged to be on the same plane and the second inductor 114 is arranged to be inside the first inductor 112 to magnetically couple with the first inductor 12 for generating a mutual inductance. That is, the first inductor 112 and the second inductor 114 have similar wiring shapes and are arranged on the same plane, and the first inductor 112 is arranged outside the second inductor 114. In another embodiment, the first inductor 112 is arranged inside the second inductor 114. The opening of the first inductor 112 and the opening of the second inductor 114 are in the opposite directions. The first switch circuit 117 is coupled in parallel with the second inductor 114. The first switch circuit 117 includes a first switch 118 and an inverter 120 for receiving the second control voltage VCTRL2 to control the first switch 118, and the second capacitive circuit 115 can also be coupled in parallel with the second inductor 114 and the first switch circuit 117. The second capacitive circuit 115 can be replaced with the second capacitive circuit 115 in FIG. 2 to generate more frequency bands. FIG. 3 is only an implementation method of the present invention. The first inductor 112 and the second inductor 114 can also be of different shapes or located on different planes to generate a mutual inductance. The first inductor 112 and the second inductor 114 are not limited to the octagonal and inner and outer configurations shown in FIG. 3.

In another embodiment, the first inductor 112 and the second inductor 114 are disposed on different planes to generate a mutual inductance. The first inductor 112 is a polygonal coil, and the second inductor 114 is also a polygonal coil corresponding to the shape of the first inductor 112, and the two coils can be located on different planes that are in parallel to each other and separated by a distance. The shape of the first inductor 112 and the shape of the second inductor 114 substantially overlap on a projection plane to generate a mutual inductance. That is, the first inductor 112 and the second inductor 114 have similar wiring shapes and are arranged on different planes, and the first inductor 112 and the second inductor 114 have similar sizes. In addition, the relative positions of the first inductor 112, the second inductor 114, the first switch circuit 117 and the second capacitive circuit 115 may be the same or similar to those in FIG. 3, and will not be further elaborated.

Figure 4:
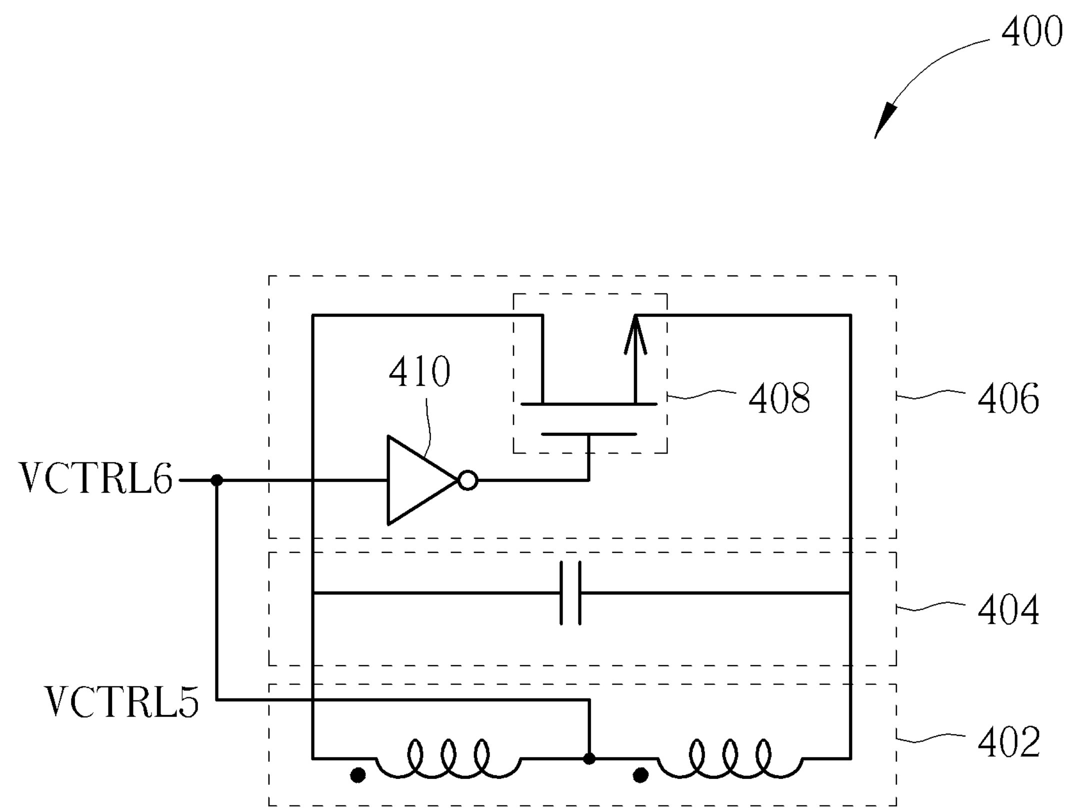
FIG. 4 is a circuit diagram of the second resonator circuit of the voltage controlled oscillator in FIG. 1A.

If the second inductor 114, the second capacitive circuit 115 and the first switch circuit 117 of the voltage controlled oscillator 100 form a first resonator circuit, then FIG. 4 is a circuit diagram of the second impedance circuit 400 of the voltage controlled oscillator 100. The embodiment of the present invention is not limited to having two resonator circuits. The first inductor 112 may be magnetically coupled to a plurality of resonator circuits. The frequency of the voltage controlled oscillator 100 is determined by the on or off of the switch of each resonator circuit. The second resonator circuit 400 includes a third inductor 402, a third capacitive circuit 404 and a third switch circuit 406 coupled in parallel. The first inductor 112 can be magnetically coupled with the second inductor 114 and the third inductor 402 at the same time. The third inductor 402 also has a center tapped node for receiving the fifth control voltage VCTRL5. The purpose of the fifth control voltage VCTRL5 is similar to that of the first control voltage VCTRL1. The third capacitive circuit 404 can be replaced with the second capacitive circuit 115 as shown in FIG. 2 to generate more frequency bands. The third switch circuit 406 includes a third switch 408 and an inverter 410. The sixth control voltage VCTRL6 can turn on or turn off the third switch 408. The fifth control voltage VCTRL5 and the sixth control voltage VCTRL6 can be the same control voltage changing synchronously.

In conclusion, the voltage controlled oscillator 100 in the present invention can control the equivalent impedance formed by the second inductor 114, the second capacitive circuit 115 and the first switch circuit 117. Through the magnetic coupling of the first inductor 112 and the second inductor 114, the oscillation frequency can be significantly changed. The voltage controlled oscillator 100 may also include fine-tunable variable capacitors 106 and 108 to fine-tune the oscillation signal frequency. In addition, the voltage controlled oscillator 100 may further include a second resonator circuit 400, or more magnetically coupled resonator circuits, and may change the capacitance value of the second capacitive circuit 115 to achieve significant changes in frequency bands of the oscillation signals. The present invention can realize a multi-band voltage controlled oscillator and reduce circuit area through the arrangement of magnetically coupled resonator circuits. In addition, the present invention allows the voltage controlled oscillator 100 to operate in a predetermined frequency band by receiving a control signal that changes synchronously with the control end of the first switch 118 through the center tapped node of the second inductor 114.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A voltage controlled oscillator, comprising:
- a cross coupled pair circuit;
- a first capacitive circuit arranged in parallel with the cross coupled pair circuit;
- a first inductor arranged in parallel with the cross coupled pair circuit, the first inductor having a center tapped node for receiving a power supply voltage;
- a second inductor magnetically coupled with the first inductor, the second inductor having a center tapped node for receiving a first control voltage;
- a second capacitive circuit arranged in parallel with the second inductor; and
- a first switch circuit arranged in parallel with the second inductor and configured to be turned on or turned off by a second control voltage;
- wherein the first control voltage and the second control voltage change synchronously.

2. The voltage controlled oscillator of claim 1, wherein:
- when the first control voltage is a first voltage and the first switch circuit is controlled to be turned on by the second control voltage, an oscillation signal of the voltage controlled oscillator has a first frequency;
- when the first control voltage is a second voltage and the first switch circuit is controlled to be turned off by the second control voltage, the oscillation signal of the voltage controlled oscillator has a second frequency; and
- the first frequency is higher than the second frequency.

3. The voltage controlled oscillator of claim 1, wherein the second capacitive circuit includes two capacitors, and a second switch circuit coupled between the two capacitors, and the second switch circuit is configured to be turned on or turned off by a third control voltage.

4. The voltage controlled oscillator of claim 3, wherein:
- when the first control voltage is a first voltage, the first switch circuit is turned on by the second control voltage, and the second switch circuit is turned on by the third control voltage, an oscillation signal of the voltage controlled oscillator has a first frequency;
- when the first control voltage is a second voltage, the first switch circuit is turned off by the second control voltage, and the second switch circuit is turned on by the third control voltage, the oscillation signal of the voltage controlled oscillator has a second frequency;
- when the first control voltage is the second voltage, the first switch circuit is turned off by the second control voltage, and the second switch circuit is turned off by the third control voltage, the oscillation signal of the voltage controlled oscillator has a third frequency; and the first frequency is higher than the third frequency, and the third frequency is higher than the second frequency.

5. The voltage controlled oscillator of claim 3, wherein the second switch circuit includes a transistor coupled between the two capacitors.

6. The voltage controlled oscillator of claim 5, wherein the second switch circuit further includes two nodes for receiving a bias voltage, and the two nodes are disposed respectively between the transistor and the two capacitors.

7. The voltage controlled oscillator of claim 1, wherein the first inductor and the second inductor have similar wiring shapes and are arranged on the same plane, and the first inductor is arranged inside or outside the second inductor.

8. The voltage controlled oscillator of claim 1, wherein the first inductor and the second inductor have similar wiring shapes and are arranged on different planes, and the first inductor and the second inductor have similar sizes.

9. The voltage controlled oscillator of claim 1, wherein the cross coupled pair circuit includes:

a first transistor including:

a first end;

a second end coupled to a reference voltage end; and a control end; and a second transistor including:

a first end coupled to the control end of the first transistor;

a second end coupled to the reference voltage end; and a control end coupled to the first end of the first transistor.

10. The voltage controlled oscillator of claim 1, wherein the first capacitive circuit is controlled by a fourth control voltage to generate different capacitance values.

11. The voltage controlled oscillator of claim 10, wherein the first capacitive circuit includes:

a first variable capacitor including:

a first end; and a second end for receiving the fourth control voltage;

a second variable capacitor including:

a first end coupled to the second end of the first variable capacitor for receiving the fourth control voltage; and a second end; and a first capacitor including:

a first end coupled to the first end of the first variable capacitor; and a second end coupled to the second end of the second variable capacitor.

12. The voltage controlled oscillator of claim 1, wherein the second capacitive circuit includes a second capacitor.

13. The voltage controlled oscillator of claim 1, wherein the first switch circuit includes a transistor arranged in parallel with the second inductor and controlled to be turned on or turned off by the second control voltage.

14. The voltage controlled oscillator of claim 13, wherein the first switch circuit further includes an inverter coupled to a control end of the transistor.

15. The voltage controlled oscillator of claim 14, wherein the inverter is configured to receive the second control voltage, and the second control voltage is the same as the first control voltage.

16. The voltage controlled oscillator of claim 1, wherein both ends of the first inductor are used to output an oscillation signal.

17. The voltage controlled oscillator of claim 1, wherein both ends of the second inductor are used to output an oscillation signal.

18. The voltage controlled oscillator of claim 1, wherein the second capacitive circuit is controlled by a third control voltage to generate different capacitance values.

19. The voltage controlled oscillator of claim 1, further comprising:

a third inductor magnetically coupled with the first inductor, and the third inductor has a center tapped node for receiving a fifth control voltage;

a third capacitive circuit coupled in parallel with the third inductor; and a third switch circuit coupled in parallel with the third inductor and configured to be turned on or turned off by a sixth control voltage;

where the fifth control voltage and the sixth control voltage change synchronously.

20. The voltage controlled oscillator of claim 19, wherein the first inductor, the second inductor and the third inductor have similar wiring shapes and are arranged on different planes, and the first inductor is magnetically coupled between the second inductor and the third inductor.

* * * * *